United States Patent
Kim et al.

(10) Patent No.: US 10,822,490 B2
(45) Date of Patent: *Nov. 3, 2020

(54) THERMOPLASTIC RESIN COMPOSITION HAVING EXCELLENT SHOCK RESISTANCE AND LIGHT RESISTANCE

(71) Applicant: Lotte Advanced Materials Co., Ltd., Yeosu-si (KR)

(72) Inventors: Yang Il Kim, Uiwang-si (KR); Chan Moo Park, Uiwang-si (KR); Tae Gon Kang, Uiwang-si (KR); Jong Cheol Lim, Uiwang-si (KR); Yoo Jin Jung, Uiwang-si (KR); Sang Hyun Hong, Uiwang-si (KR)

(73) Assignee: Lotte Advanced Materials Co., Ltd., Yeosu-si (KR)

(*) Notice: Subject to any disclaimer, the term of this patent is extended or adjusted under 35 U.S.C. 154(b) by 0 days.

This patent is subject to a terminal disclaimer.

(21) Appl. No.: 15/107,210

(22) PCT Filed: Jun. 10, 2014

(86) PCT No.: PCT/KR2014/005080
§ 371 (c)(1),
(2) Date: Jun. 22, 2016

(87) PCT Pub. No.: WO2015/102177
PCT Pub. Date: Jul. 9, 2015

(65) Prior Publication Data
US 2017/0037240 A1 Feb. 9, 2017

(30) Foreign Application Priority Data
Dec. 30, 2013 (KR) .......... 10-2013-0167879

(51) Int. Cl.
| C08L 67/02 | (2006.01) |
| C08K 3/22 | (2006.01) |
| C08K 3/013 | (2018.01) |
| C08J 3/20 | (2006.01) |
| C08J 5/00 | (2006.01) |
| C08L 51/08 | (2006.01) |
| H01L 33/60 | (2010.01) |

(52) U.S. Cl.
CPC .............. *C08L 67/02* (2013.01); *C08J 3/203* (2013.01); *C08J 5/00* (2013.01); *C08K 3/013* (2018.01); *C08K 3/22* (2013.01); *C08J 2367/02* (2013.01); *C08J 2451/04* (2013.01); *C08L 51/085* (2013.01); *C08L 2203/20* (2013.01); *C08L 2207/53* (2013.01); *H01L 33/60* (2013.01); *H01L 2933/0033* (2013.01); *H01L 2933/0058* (2013.01)

(58) Field of Classification Search
CPC ....................................................... C08L 67/02
See application file for complete search history.

(56) References Cited

U.S. PATENT DOCUMENTS

| 4,006,272 A | 2/1977 | Sakaguchi et al. |
| 4,027,073 A | 5/1977 | Clark |
| 4,034,013 A | 7/1977 | Lane |
| 4,045,514 A | 8/1977 | Iwahashi et al. |
| 4,139,600 A | 2/1979 | Rollmann et al. |
| 4,177,185 A | 12/1979 | Tacke et al. |
| 4,180,494 A | 12/1979 | Fromuth et al. |
| 4,185,044 A | 1/1980 | Tacke et al. |
| 4,287,315 A | 9/1981 | Meyer et al. |
| 4,303,772 A | 12/1981 | Novicky |
| 4,393,153 A | 7/1983 | Hepp |
| 4,400,333 A | 8/1983 | Neefe |
| 4,639,480 A | 1/1987 | Birum |
| 4,664,983 A | 5/1987 | Nakamura et al. |
| 4,694,031 A | 9/1987 | Morita et al. |
| 4,745,029 A | 5/1988 | Kambour |
| 4,753,980 A | 6/1988 | Deyrup |
| 4,788,251 A | 11/1988 | Brown et al. |
| 4,803,235 A | 2/1989 | Okada |
| 4,900,610 A | 2/1990 | Hochberg et al. |
| 4,906,202 A | 3/1990 | Germ |
| 4,906,696 A | 3/1990 | Fischer et al. |
| 4,990,549 A | 2/1991 | Delvin et al. |
| 5,025,066 A | 6/1991 | DeRudder et al. |
| 5,061,558 A | 10/1991 | Fischer et al. |
| 5,068,285 A | 11/1991 | Laughner |
| 5,124,402 A | 6/1992 | Laughner et al. |

(Continued)

FOREIGN PATENT DOCUMENTS

| CN | 1285858 A | 2/2001 |
| CN | 1376182 A | 11/2002 |

(Continued)

OTHER PUBLICATIONS

International Search Report in counterpart International Application No. PCT/KR2014/005080 dated Sep. 26, 2014, pp. 1-4.
Office Action in counterpart Chinese Application No. 201480071500.2 dated Jan. 25, 2017, pp. 1-7.
Full Translation of Higuchi et al. JP 2007-218980, pp. 1-32.
Office Action in commonly owned U.S. Appl. No. 13/728,177 dated Oct. 23, 2013, pp. 1-7.
Office Action in commonly owned U.S. Appl. No. 13/728,177 dated Feb. 10, 2014, pp. 1-13.
Office Action in commonly owned U.S. Appl. No. 13/332,788 dated Nov. 28, 2012, pp. 1-8.
Final Office Action in commonly owned U.S. Appl. No. 13/332,788 dated Jul. 25, 2013, pp. 1-12.

(Continued)

Primary Examiner — Michael F Pepitone
(74) Attorney, Agent, or Firm — Additon, Higgins & Pendleton, P.A.

(57) ABSTRACT

The present invention can provide a thermoplastic resin composition which contains (A) a polyester resin, (B) a white pigment, and (C) a silicon-containing graft copolymer, and thus has excellent light efficiency, discoloration resistance, and light stability, without degrading shock resistance and molding processability.

15 Claims, No Drawings

(56) References Cited

U.S. PATENT DOCUMENTS

| | | |
|---|---|---|
| 5,189,091 A | 2/1993 | Laughner |
| 5,200,492 A | 4/1993 | Ohnaga et al. |
| 5,219,915 A | 6/1993 | McKee et al. |
| 5,242,967 A | 9/1993 | Minnick |
| 5,256,718 A | 10/1993 | Yamamoto et al. |
| 5,280,070 A | 1/1994 | Drzewinski et al. |
| 5,284,916 A | 2/1994 | Drzewinski |
| 5,292,809 A | 3/1994 | Drzewinski et al. |
| 5,308,894 A | 5/1994 | Laughner |
| 5,369,154 A | 11/1994 | Laughner |
| 5,382,628 A | 1/1995 | Stewart et al. |
| 5,441,997 A | 8/1995 | Walsh et al. |
| 5,449,557 A | 9/1995 | Liebler et al. |
| 5,470,658 A | 11/1995 | Gasca et al. |
| 5,529,716 A | 6/1996 | Nomura et al. |
| 5,841,088 A | 11/1998 | Yamaguchi et al. |
| 5,849,380 A | 12/1998 | Kashiba et al. |
| 5,863,974 A | 1/1999 | Tjahjadi et al. |
| 6,060,538 A | 5/2000 | Gallucci |
| 6,238,732 B1 | 5/2001 | Cameron et al. |
| 6,252,002 B1 | 6/2001 | Yamada et al. |
| 6,277,905 B1 | 8/2001 | Keep |
| 6,310,129 B1 | 10/2001 | Lilly et al. |
| 6,486,251 B1 | 11/2002 | Patel |
| 6,506,830 B1 | 1/2003 | Bussi et al. |
| 6,545,089 B1 | 4/2003 | DeRudder et al. |
| 6,646,068 B2 | 11/2003 | Chisholm et al. |
| 6,653,391 B1 | 11/2003 | Weber et al. |
| 7,009,029 B2 | 3/2006 | Oka et al. |
| 7,294,659 B2 | 11/2007 | Yatake |
| 7,385,013 B2 | 6/2008 | Kobayashi et al. |
| 7,671,143 B2 | 3/2010 | Lee et al. |
| 7,732,515 B2 | 6/2010 | Jang et al. |
| 7,960,464 B2 | 6/2011 | Kobayashi et al. |
| 8,044,134 B2 | 10/2011 | Chung et al. |
| 8,044,143 B2 | 10/2011 | Park et al. |
| 8,178,608 B2 | 5/2012 | Nakamura et al. |
| 8,304,481 B2 | 11/2012 | Nakamura et al. |
| 8,426,549 B2 | 4/2013 | Ogasawara |
| 8,815,993 B2 | 8/2014 | Kim et al. |
| 8,933,158 B2 | 1/2015 | Shiobara et al. |
| 9,018,296 B2 | 4/2015 | Lee et al. |
| 9,062,198 B2 | 6/2015 | Lu |
| 9,187,621 B2 | 11/2015 | Lu |
| 9,437,790 B2 | 9/2016 | Kim et al. |
| 2002/0042483 A1 | 4/2002 | Vanderbilt |
| 2002/0111409 A1 | 8/2002 | Talibuddin |
| 2003/0032725 A1 | 2/2003 | Gaggar et al. |
| 2004/0102604 A1 | 5/2004 | Bassler et al. |
| 2004/0175466 A1 | 9/2004 | Douglas et al. |
| 2005/0113532 A1 | 5/2005 | Fish, Jr. et al. |
| 2005/0159533 A1 | 7/2005 | Nabeshima et al. |
| 2005/0165207 A1 | 7/2005 | Agarwal et al. |
| 2005/0239949 A1 | 10/2005 | Nakamura et al. |
| 2006/0004154 A1 | 1/2006 | DeRudder et al. |
| 2006/0030647 A1 | 2/2006 | Ebeling et al. |
| 2006/0051587 A1 | 3/2006 | Mori et al. |
| 2006/0100307 A1 | 5/2006 | Uerz et al. |
| 2006/0135690 A1 | 6/2006 | Juikar et al. |
| 2007/0155913 A1 | 7/2007 | Chakravarti et al. |
| 2007/0161741 A1 | 7/2007 | Ogasawara |
| 2007/0213458 A1* | 9/2007 | Topoulos .......... C08K 5/005 524/601 |
| 2007/0265371 A1 | 11/2007 | Takahashi et al. |
| 2007/0282056 A1 | 12/2007 | Schellekens et al. |
| 2008/0009571 A1 | 1/2008 | Pixton et al. |
| 2008/0146718 A1 | 6/2008 | Gijsman et al. |
| 2008/0153954 A1 | 6/2008 | Arpin |
| 2008/0242789 A1* | 10/2008 | Zhu .......... C08L 67/02 524/451 |
| 2009/0069479 A1 | 3/2009 | Seki |
| 2009/0080079 A1 | 3/2009 | Kogure et al. |
| 2009/0118402 A1 | 5/2009 | Jang et al. |
| 2009/0143267 A1 | 6/2009 | Zhang et al. |
| 2009/0209696 A1 | 8/2009 | Lee et al. |
| 2009/0215934 A1 | 8/2009 | Nakamura et al. |
| 2009/0253847 A1 | 10/2009 | Komatsu et al. |
| 2009/0275678 A1 | 11/2009 | Kumazawa et al. |
| 2010/0029855 A1 | 2/2010 | Matsuoka et al. |
| 2010/0113648 A1 | 5/2010 | Niessner et al. |
| 2010/0113656 A1 | 5/2010 | Saga |
| 2010/0152357 A1 | 6/2010 | Kwon et al. |
| 2010/0160529 A1 | 6/2010 | Lee et al. |
| 2010/0160532 A1 | 6/2010 | Park et al. |
| 2010/0168272 A1 | 7/2010 | Park et al. |
| 2010/0197827 A1 | 8/2010 | Kim et al. |
| 2010/0227957 A1 | 9/2010 | Fujii |
| 2010/0240831 A1 | 9/2010 | Kim et al. |
| 2010/0256288 A1 | 10/2010 | Kim et al. |
| 2011/0009524 A1 | 1/2011 | Kwon et al. |
| 2011/0021677 A1 | 1/2011 | Kwon et al. |
| 2011/0040019 A1 | 2/2011 | Kwon et al. |
| 2011/0160380 A1 | 6/2011 | Kwon et al. |
| 2011/0310622 A1 | 12/2011 | Topoulos |
| 2012/0065318 A1 | 3/2012 | Park et al. |
| 2012/0129989 A1 | 5/2012 | Kim et al. |
| 2012/0165448 A1 | 6/2012 | Lee et al. |
| 2012/0264868 A1 | 10/2012 | Lu |
| 2012/0264871 A1* | 10/2012 | Moon .......... C08F 283/12 524/537 |
| 2012/0305287 A1 | 12/2012 | Ni |
| 2012/0329938 A1* | 12/2012 | Kim .......... C08K 3/0033 524/494 |
| 2013/0005875 A1 | 1/2013 | Shoji et al. |
| 2013/0158184 A1 | 6/2013 | Topoulos |
| 2013/0172453 A1 | 7/2013 | Lee et al. |
| 2013/0217830 A1 | 8/2013 | Crawford et al. |
| 2013/0281587 A1 | 10/2013 | Shim et al. |
| 2014/0167088 A1 | 6/2014 | Lu |
| 2014/0167091 A1 | 6/2014 | Ogasawara et al. |
| 2014/0187662 A1 | 7/2014 | Lee et al. |
| 2014/0187700 A1 | 7/2014 | Lee et al. |
| 2014/0309356 A1 | 10/2014 | Kim et al. |
| 2014/0350163 A1 | 11/2014 | Kim et al. |

FOREIGN PATENT DOCUMENTS

| | | |
|---|---|---|
| CN | 101550282 A | 10/2009 |
| CN | 101560325 A | 10/2009 |
| CN | 101597423 A | 12/2009 |
| CN | 101747602 A | 6/2010 |
| CN | 102725349 A | 10/2012 |
| CN | 102838849 A | 12/2012 |
| CN | 103270114 A | 8/2013 |
| CN | 103910979 A | 7/2014 |
| CN | 103911000 A | 7/2014 |
| DE | 19845317 A1 | 4/2000 |
| DE | 69829099 T2 | 12/2005 |
| DE | 10 2013 226 703 A1 | 7/2014 |
| EP | 0033393 A2 | 8/1981 |
| EP | 0114288 A2 | 8/1984 |
| EP | 0180417 A2 | 5/1986 |
| EP | 0246620 A2 | 5/1987 |
| EP | 0376616 A2 | 7/1990 |
| EP | 0528462 A1 | 2/1993 |
| EP | 0787769 A2 | 8/1997 |
| EP | 1010725 A2 | 6/2000 |
| EP | 1147812 A1 | 10/2001 |
| EP | 2204412 A1 | 7/2010 |
| JP | 53-134799 A | 11/1978 |
| JP | 57-125241 A | 8/1982 |
| JP | 58-196250 A | 11/1983 |
| JP | 62-268612 A | 11/1987 |
| JP | 04-023856 A | 1/1992 |
| JP | 04-359954 A | 12/1992 |
| JP | 05-005055 | 1/1993 |
| JP | 05-098136 A | 4/1993 |
| JP | 05-125260 A | 5/1993 |
| JP | 05-194829 | 8/1993 |
| JP | 06-122771 A | 5/1994 |
| JP | 06-136212 A | 5/1994 |
| JP | 1994-200132 A | 7/1994 |
| JP | 06-313089 A | 11/1994 |
| JP | 07-026101 | 1/1995 |

(56) References Cited

FOREIGN PATENT DOCUMENTS

| | | |
|---|---|---|
| JP | 1995-228776 | 8/1995 |
| JP | 10-060241 A | 3/1998 |
| JP | 10-060242 A | 3/1998 |
| JP | 10-219026 A | 8/1998 |
| JP | 11-129246 A | 5/1999 |
| JP | 11-171984 A | 6/1999 |
| JP | 11-181168 A | 7/1999 |
| JP | 11-279385 | 10/1999 |
| JP | 2000-063641 A | 2/2000 |
| JP | 2000-204244 A | 7/2000 |
| JP | 2000-264959 A | 9/2000 |
| JP | 2000-265001 A | 9/2000 |
| JP | 2000-327992 | 11/2000 |
| JP | 2001-049072 A | 2/2001 |
| JP | 2002-001125 A | 1/2002 |
| JP | 2002-080676 A | 3/2002 |
| JP | 2002-201344 A | 7/2002 |
| JP | 2002-294070 A | 10/2002 |
| JP | 2003-525335 | 8/2003 |
| JP | 2003-313392 | 11/2003 |
| JP | 2004-075994 A | 3/2004 |
| JP | 4325753 A | 12/2004 |
| JP | 4915155 A | 12/2004 |
| JP | 2005-097462 A | 4/2005 |
| JP | 2005-220173 A | 8/2005 |
| JP | 2006-249292 A | 9/2006 |
| JP | 2006-257284 A | 9/2006 |
| JP | 2006-342246 A | 12/2006 |
| JP | 2007-077222 | 3/2007 |
| JP | 2007-084952 A | 4/2007 |
| JP | 2007-218980 | 8/2007 |
| JP | 2008-013702 A | 1/2008 |
| JP | 2008-505233 A | 2/2008 |
| JP | 2009-507990 A1 | 2/2009 |
| JP | 2009-173015 A | 8/2009 |
| JP | 2009-263640 A | 11/2009 |
| JP | 2011-094026 A | 5/2011 |
| JP | 2013-251510 A | 12/2013 |
| JP | 2014-148615 A | 8/2014 |
| KR | 10-1999-0018287 | 3/1993 |
| KR | 1996-0007611 B1 | 6/1996 |
| KR | 10-1998-0004915 | 6/1998 |
| KR | 10-1998-027070 | 7/1998 |
| KR | 1998-055579 | 9/1998 |
| KR | 10-1999-0029495 A | 4/1999 |
| KR | 10-1999-0054644 | 7/1999 |
| KR | 10-2000-0038719 A | 7/2000 |
| KR | 10-2000-0048033 A | 7/2000 |
| KR | 10-2001-0032100 A | 4/2001 |
| KR | 10-2001-0070975 A | 7/2001 |
| KR | 2004-0079118 A | 9/2004 |
| KR | 10-2005-0032100 A | 4/2005 |
| KR | 10-0514272 B | 9/2005 |
| KR | 10-2005-0109049 A | 11/2005 |
| KR | 10-0581437 B | 5/2006 |
| KR | 10-2006-0135649 A | 12/2006 |
| KR | 10-0709878 B1 | 4/2007 |
| KR | 10-2007-0070686 A | 7/2007 |
| KR | 10-2007-0072372 A | 7/2007 |
| KR | 10-2007-0072375 A | 7/2007 |
| KR | 10-2007-0093994 A | 9/2007 |
| KR | 10-0767428 A1 | 10/2007 |
| KR | 2007-7026437 A | 12/2007 |
| KR | 10-2008-0062975 A | 7/2008 |
| KR | 10-2008-0063054 A | 7/2008 |
| KR | 10-0871436 B1 | 11/2008 |
| KR | 10-2009-0030511 A | 3/2009 |
| KR | 10-0886348 B1 | 3/2009 |
| KR | 10-2010-0071715 | 6/2010 |
| KR | 10-2011-0078044 A | 7/2011 |
| KR | 10-2012-0066740 A | 6/2012 |
| KR | 10-2012-0140332 A | 12/2012 |
| KR | 10-2013-0076027 A | 7/2013 |
| KR | 10-2013-0076733 A | 7/2013 |
| KR | 10-2013-0116813 A | 10/2013 |
| KR | 10-2014-0075517 A | 6/2014 |
| TW | 201306319 A | 2/2013 |
| TW | 201343743 A | 11/2013 |
| TW | 201343777 A | 11/2013 |
| WO | 02/088044 A1 | 11/2002 |
| WO | 2003/085029 A1 | 10/2003 |
| WO | 2005/075554 A1 | 8/2005 |
| WO | 2007/119920 A1 | 10/2007 |
| WO | 2007/140101 A1 | 12/2007 |
| WO | 2008/039017 A1 | 4/2008 |
| WO | 2008/081791 A1 | 7/2008 |
| WO | 2009/078593 A1 | 6/2009 |
| WO | 2009/078602 A1 | 6/2009 |
| WO | 2009/113762 A2 | 9/2009 |
| WO | 2009/116722 A1 | 9/2009 |
| WO | 2009/128601 A1 | 10/2009 |
| WO | 2010/143796 A1 | 12/2010 |
| WO | 2011/013882 A1 | 2/2011 |
| WO | 2012/081801 A1 | 6/2012 |
| WO | 2013/100578 A1 | 7/2013 |
| WO | 2013/101277 A1 | 7/2013 |
| WO | 2013125453 A | 8/2013 |
| WO | 2013/129201 A1 | 9/2013 |
| WO | WO-2014095648 A1 * | 6/2014 ............ C08L 83/10 |
| WO | 2015/102177 A1 | 7/2015 |

OTHER PUBLICATIONS

Office Action in commonly owned U.S. Appl. No. 14/067,139 dated May 22, 2014, pp. 1-8.
International Search Report in commonly owned International Application No. PCT/KR2011/006328 dated Apr. 4, 2012, pp. 1-4.
Notice of Allowance in commonly owned U.S. Appl. No. 13/728,177 dated May 30, 2014, pp. 1-5.
Final Office Action in commonly owned U.S. Appl. No. 13/915,655 dated Jun. 23, 2014, pp. 1-5.
Notice of Allowance in commonly owned U.S. Appl. No. 13/915,655 dated Oct. 15, 2014, pp. 1-7.
Office Action in commonly owned Korean Application No. 10-2014-0182421 dated Jan. 26, 2017, pp. 1-5.
Wypych, "2.1.67 Wollastonite," Handbook of Fillers, 3d Ed., pp. 151-152, Toronto, Ontario: ChemTec Publishing (2010).
Office Action in commonly owned Korean Application No. 10-2014-0138130 dated Nov. 16, 2016, pp. 1-5.
Office Action in commonly owned U.S. Appl. No. 14/971,348 dated Apr. 14, 2017, pp. 1-15.
Office Action in commonly owned Chinese Application No. 201510633614.8 dated Dec. 12, 2016, pp. 1-7.
Office Action in commonly owned U.S. Appl. No. 14/044,906 dated Sep. 15, 2014, pp. 1-6.
Notice of Allowance in commonly owned U.S. Appl. No. 14/044,906 dated Dec. 29, 2014, pp. 1-6.
Office Action in commonly owned U.S. Appl. No. 13/332,736 dated Sep. 17, 2013.
Notice of Allowance in commonly owned U.S. Appl. No. 13/332,736 dated Apr. 17, 2014, pp. 1-8.
Office Action in commonly owned U.S. Appl. No. 14/102,535 dated Sep. 26, 2014, pp. 1-8.
Office Action in commonly owned U.S. Appl. No. 14/552,765 dated Sep. 26, 2016, pp. 1-8.
Office Action in commonly owned Taiwanese Application No. 104132047 dated Jun. 4, 2016, pp. 1-7.
Office Action in commonly owned U.S. Appl. No. 14/862,467 dated Nov. 8, 2016, pp. 1-8.
Office Action in commonly owned U.S. Appl. No. 14/552,765 dated May 10, 2017, pp. 1-8.
Office Action in commonly owned German Application No. 102014224495.1 dated Feb. 15, 2017, pp. 1-8.
Office Action in commonly owned Chinese Application No. 201510946837.X dated Mar. 3, 2017, pp. 1-10.
Final Office Action in commonly owned U.S. Appl. No. 14/862,467 dated May 30, 2017, pp. 1-13.
Office Action in commonly owned Chinese Application No. 201510359435.X dated Jun. 17, 2016, pp. 1-7.

(56) References Cited

OTHER PUBLICATIONS

Office Action in commonly owned U.S. Appl. No. 14/748,879 dated May 25, 2017, pp. 1-15.
Final Office Action commonly owned U.S. Appl. No. 14/491,348 dated Aug. 9, 2017, pp. 1-19.
European Search Report in commonly owned European Application No. 08862371 dated Dec. 7, 2010, pp. 1-6.
International Search Report in commonly owned International Application No. PCT/KR2008/006870, dated May 28, 2009, pp. 1-2.
Office Action in commonly owned U.S. Appl. No. 12/631,018 dated Nov. 8, 2011, pp. 1-10.
Chinese Office Action in commonly owned Chinese Application No. 200910211954 dated Jun. 23, 2011, pp. 1-5.
English translation of Chinese Office Action in commonly owned Chinese Application No. 200910211954 dated Jun. 23, 2011, pp. 1-5.
Katrizky et al., "Correlation and Prediction of the Refractive Indices of Polymers by QSPR", Journal of Chemical Information and Computer Sciences, pp. 1171-1176, (1998).
Office Action in commonly owned U.S. Appl. No. 12/642,904 dated Dec. 14, 2011, pp. 1-9.
European Search Report in commonly owned European Application No. 09180634 dated Feb. 2, 2010, pp. 1-3.
Xu, "Predicition of Refractive Indices of Linear Polymers by a four-descriptor QSPR model", Polymer, 45 (2004) pp. 8651-8659.
European Search Report in commonly owned European Application No. 10196806 dated Apr. 27, 2011, pp. 1-5.
European Search Report in commonly owned European Application No. 08873425.6 dated May 29, 2012, pp. 1-5.
International Search Report in commonly owned International Application No. PCT/KR2008/007157, dated May 28, 2009, pp. 1-2
Office Action in commonly owned U.S. Appl. No. 12/792,176 dated Nov. 16, 2011, pp. 1-12.
International Search Report in commonly owned International Application No. PCT/KR2008/007825, dated Aug. 28, 2009, pp. 1-2.
Office Action in commonly owned U.S. Appl. No. 12/880,209 dated Feb. 16, 2011, pp. 1-10.
Final Office Action in commonly owned U.S. Appl. No. 12/880,209 dated Jul. 29, 2011, pp. 1-9.
Advisory Action in commonly owned U.S. Appl. No. 12/880,209 dated Nov. 4, 2011, pp. 1-4.
International Search Report in commonly owned International Application No. PCT/KR2008/007820 dated Jul. 28, 2009, pp. 1-2.
Final Office Action in commonly owned U.S. Appl. No. 12/792,176 dated Apr. 19, 2012, pp. 1-10.
International Search Report in commonly owned International Application No. PCT/KR2009/007944 dated Aug. 13, 2010, pp. 1-6.
Full English Translation of JP 04-359953, pp. 1-10.
Full English Translation of JP 04-359954, pp. 1-8.
International Search Report in commonly owned International Application No. PCT/KR2012/011485 dated Apr. 16, 2013, 1-4.
Poly(cyclohexanedimethylene terephthalate), pp. 1-2, obtained online from http://www.polymerprocessing.com/polymers/PCT.html. No publication date given.
Office Action in commonly owned U.S. Appl. No. 14/367,416 dated Oct. 20, 2014, pp. 1-27.
Office Action in commonly owned Korean Application No. 10-2015-0093747 dated Apr. 14, 2017, pp. 1-6.
Office Action in commonly owned Chinese Patent Application No. 201610520653.1 dated May 19, 2017, pp. 1-7.
Office Action in commonly owned Korean Application No. 10-2015-0078825 dated Mar. 29, 2017, pp. 1-6.
Office Action in commonly owned U.S. Appl. No. 15/195,128 dated Jun. 14, 2017, pp. 1-11.
Turner et al., "Cyclohexanedimethanol Polyesters", 2001, pp. 127-134.
Advisory Action in commonly owned U.S. Appl. No. 15/195,128 dated Jan. 25, 2018, pp. 1-4.
Notice of Allowance in commonly owned U.S. Appl. No. 14/862,467 dated Aug. 8, 2017, pp. 1-7.
Final Office Action in commonly owned U.S. Appl. No. 14/552,765 dated Dec. 13, 2017, pp. 1-10.
Taiwanese Office Action in commonly owned Taiwanese Application No. 96136059 dated May 5, 2011, pp. 1-9.
English Translation of Taiwanese Office Action in commonly owned Taiwanese Application No. 96136059 dated May 5, 2011, pp. 1-5.
European Search Report in commonly owned European Application No. 07808474 dated Sep. 28, 2011, pp. 1-4.
International Preliminary Report on Patentability in commonly owned International Application No. PCT/KR2007/004743, dated Mar. 31, 2009, pp. 1-5.
International Search Report in commonly owned International Application No. PCT/KR2007/004743, dated Jan. 4, 2008, pp. 1-2.
Office Action in commonly owned Application Serial No. 12/413,630 dated Jun. 23, 2009, pp. 1-9.
Final Office Action in commonly owned Application U.S. Appl. No. 12/413,630 dated Dec. 7, 2009, pp. 1-9.
Advisory Action in commonly owned U.S. Appl. No. 12/413,630 dated Apr. 9, 2010, pp. 1-3.
French Search Report and Written Opinion in commonly owned French Application No. 0959193 dated May 27, 2010, pp. 1-5.
Office Action in commonly owned U.S. Appl. No. 12/640,343 dated Aug. 29, 2011, pp. 1-7.
Office Action in commonly owned U.S. Appl. No. 12/640,343 dated Feb. 22, 2012, pp. 1-13.
Final Office Action in commonly owned U.S. Appl. No. 12/640,343 dated Jun. 5, 2012, pp. 1-12.
Office Action in commonly owned U.S. Appl. No. 12/641,752 dated Jan. 10, 2011, pp. 1-10.
Notice of Allowance in commonly owned U.S. Appl. No. 12/641,752 dated Jul. 20, 2011, pp. 1-9.
International Search Report in commonly owned International Application No. PCT/KR2009/007917 dated Aug. 24, 2010, pp. 1-9.
English-translation of Abstract for Korean Publication No. 1998-055579, published Sep. 25, 1998, pp. 1.
Igranox 1076, SpecialChem, Ciba, now part of BASF, 2012 Retrieved online<http://www.specialchem4adhesives.com>, pp. 1.
Office Action in commonly owned U.S. Appl. No. 13/362,068 dated Apr. 6, 2012, pp. 1-24.
Chinese Search Report in commonly owned Chinese Application No. 200980159831.0 dated Dec. 17, 2012, pp. 1-2.
Office Action in commonly owned U.S. Appl. No. 13/300,746 dated Jul. 31, 2013, pp. 1-14.
Advisory Action in commonly owned U.S. Appl. No. 13/300,746 dated Mar. 22, 2013, pp. 1-7.
Office Action in commonly owned U.S. Appl. No. 13/300,746 dated Apr. 9, 2012, pp. 1-19.
Office Action in commonly owned U.S. Appl. No. 13/300,746 dated Sep. 11, 2012, pp. 1-20.
Final Office Action in commonly owned U.S. Appl. No. 13/300,746 dated Jan. 3, 2013, pp. 1-14.
Final Office Action in commonly owned U.S. Appl. No. 13/300,746 dated Jan. 8, 2013, pp. 1-14.
Office Action in commonly owned U.S. Appl. No. 14/367,416 dated Mar. 4, 2015, pp. 1-35.
Final Office Action in commonly owned U.S. Appl. No. 14/748,879 dated Nov. 1, 2017, pp. 1-17.
Final Office Action in commonly owned U.S. Appl. No. 15/195,128 dated Nov. 2, 2017, pp. 1-15.
Office Action in counterpart Japanese Application No. 2016-543678 dated Dec. 26, 2017, pp. 1-4.
Office Action commonly owned Japanese Application No. 2014-242031 dated May 1, 2018, pp. 1-5.
Office Action commonly owned U.S. Appl. No. 14/971,348 dated Mar. 8, 2019, pp. 1-10.
Devaney, R., "The structure and electrical properties of poly(1,4-cyclohexylenedimethylene terephthalate), a new linear thermoplastic polyester," National Academy of Sciences—National Research Council, vol. 1080, pp. 32-35 (Year 1963).

\* cited by examiner

THERMOPLASTIC RESIN COMPOSITION HAVING EXCELLENT SHOCK RESISTANCE AND LIGHT RESISTANCE

CROSS-REFERENCE TO RELATED APPLICATIONS

This application claims priority to and the benefit of International Application No. PCT/KR2014/005080, filed Jun. 10, 2014, which published as WO 2015/102177 on Jul. 9, 2015, and Korean Patent Application No. 10-2013-0167879, filed in the Korean Intellectual Property Office on Dec. 30, 2013, the entire disclosure of each of which is incorporated herein by reference.

TECHNICAL FIELD

The present invention relates to a thermoplastic resin composition. More particularly, the present invention relates to a polyester-based thermoplastic resin composition which has excellent impact resistance and light resistance.

BACKGROUND ART

Recently, there is increasing demand for displays using new light sources such as light emitting diodes (LEDs) and organic light emitting diodes (OLEDs). Such displays have relatively long lifespan and high efficiency.

Such a display is composed of a reflector, a reflector cup, a scrambler, a housing, and the like. A material for these components is required to sustain high temperature and minimize deterioration in whiteness due to yellowing and deterioration in reflectivity.

Polyesters, copolymers thereof, and blends thereof, which are engineering plastics, have useful properties and thus can be applied to various fields including interior/exterior materials for products.

Such a polyester resin can be used as a material for illumination displays. A highly heat resistant polyester resin commonly used as the material is not deformed at high temperature and has good discoloration resistance, but exhibits poor impact resistance. In order to overcome this problem, there has been proposed a method of introducing an additive capable of improving impact resistance of the resin. However, this method has a problem in that the polyester resin can suffer from deterioration in moldability and long-term stability such as discoloration resistance.

U.S. Pat. No. 7,009,029 (Document 1) discloses a polyamide resin composition which can exhibit excellent properties in terms of heat resistance and reflectivity by adding an additive such as photostabilizers in order to improve photostability and discoloration resistance of the resin. However, use of such an additive can cause deterioration in mechanical properties.

Therefore, there is a need for a thermoplastic resin composition which is used as a material for displays and can exhibit excellent properties in terms of optical efficiency, discoloration resistance, and impact resistance without deterioration in impact resistance and moldability.

DISCLOSURE

Technical Problem

The present invention has been conceived to solve such a problem in the art and it is an aspect of the present invention to provide a polyester-based thermoplastic resin composition which exhibits excellent properties in terms of impact resistance, reflectivity, discoloration resistance, and light resistance.

It is another aspect of the present invention to provide a molded article which is manufactured using the thermoplastic resin composition as set forth above and has excellent properties in terms of impact resistance and long-term photostability.

Technical Solution

In accordance with one aspect of the present invention, there is provided a thermoplastic resin composition including: (A) a polyester resin, (B) a white pigment, and (C) a silicon-containing graft copolymer.

In one embodiment, the thermoplastic resin composition may include 0.1 parts by weight to 10 parts by weight of the silicon-containing graft copolymer (C) based on 100 parts by weight of a base resin including 30 wt % to 88 wt % of the polyester resin (A) and 20 wt % to 70 wt % of the white pigment (B).

In one embodiment, the silicon-containing graft copolymer (C) may have a core-shell structure in which a vinyl monomer is grafted to a silicon-based rubber core to form a shell.

In one embodiment, the silicon-containing graft copolymer (C) may be prepared by grafting a vinyl monomer to a silicon-based rubber containing 20 wt % to 95 wt % of silicon.

In one embodiment, the silicon-based rubber core of the silicon-containing graft copolymer (C) may be prepared from a cyclosiloxane compound selected from the group consisting of hexamethylcyclotrisiloxane, octamethylcyclotetrasiloxane, decamethylcyclopentasiloxane, dodecamethylcyclohexasiloxane, trimethyltriphenylcyclosiloxane, tetramethyltetraphenylcyclotetrasiloxane, octaphenylcyclotetrasiloxane, and a mixture thereof.

In one embodiment, the poly ester resin may be polycyclohexanedimethylene terephthalate (PCT).

In one embodiment, the polyester resin may include a diol component comprising 15 mol % to 100 mol % of 1,4-cyclohexanedimethanol and 0 mol % to 85 mol % of ethylene glycol.

In one embodiment, the white pigment may include at least one selected from the group consisting of titanium oxide, zinc oxide, zinc sulfide, white lead, zinc sulfate, barium sulfate, calcium carbonate, aluminum oxide, and a mixture thereof.

In one embodiment, the thermoplastic resin composition may further include at least one filler selected from the group consisting of glass fibers, carbon fibers, glass beads, glass flakes, carbon black, clay, kaolin, talc, mica, calcium carbonate, wollastonite, and a mixture thereof.

In accordance with another aspect of the present invention, there is provided a molded article produced using the polyester resin composition as set forth above. In one embodiment, the molded article may be a reflector for LEDs.

Advantageous Effects

According to the present invention, a thermoplastic resin composition exhibits excellent properties in terms of reflectivity, discoloration resistance, and light resistance without deterioration in heat resistance, impact resistance, and moldability.

According to the present invention, a molded article produced using the thermoplastic resin composition according to the invention has excellent properties in terms of impact resistance, optical efficiency, and photostability.

BEST MODE

Hereinafter, embodiments of the present invention will be described in detail. It should be understood that the following embodiments are provided for complete disclosure and thorough understanding of the invention by those skilled in the art. In addition, unless otherwise stated, technical and scientific terms as used herein have a meaning generally understood by those skilled in the art. Descriptions of known functions and constructions which may unnecessarily obscure the subject matter of the present invention will be omitted.

As used herein, unless otherwise stated, the term "substituted" means that at least one hydrogen atom among functional groups of the present invention is substituted with a substituent selected from among a halogen atom, a hydroxyl group, a nitro group, a cyano group, an amino group, an azido group, an amidino group, a hydrazine group, a hydrazone group, a carbonyl group, a carbamoyl group, a thiol group, an ester group, a carboxyl group or a salt thereof, a sulfonic acid or a salt thereof, a phosphoric acid group or a salt thereof, a $C_1$ to $C_{20}$ alkyl group, a $C_2$ to $C_{20}$ alkenyl group, a $C_2$ to $C_{20}$ alkinyl group, a $C_1$ to $C_{20}$ alkoxy group, a $C_6$ to $C_{30}$ aryl group, a $C_6$ to $C_{30}$ aryloxy group, a $C_3$ to $C_{30}$ cycloalkyl group, a $C_3$ to $C_{30}$ cycloalkenyl group, a $C_3$ to $C_{30}$ cycloalkinyl group, or a combination thereof.

The present inventors have conducted research to develop a thermoplastic resin composition, which exhibits excellent properties in terms of initial reflectivity, long-term reflectivity retention and discoloration resistance, and has improved impact resistance while maintaining intrinsic properties, and, from the results of such research, have found that a thermoplastic resin composition including a polyester resin, a white pigment, and a silicon-containing graft copolymer can realize optical efficiency and photostability for a long time while exhibiting improved impact resistance, thereby completing the present invention.

A thermoplastic resin composition according to this invention includes (A) a polyester resin, (B) a white pigment, and (C) a silicon-containing graft copolymer.

Hereinafter, each component of the thermoplastic resin composition according to the present invention will be described in more detail.

(A) Polyester Resin

The polyester resin may be used to improve heat resistance and mechanical properties of the resin composition at high temperature during a manufacturing process of LED components. The polyester resin contains a cyclic structure in a polymer backbone and thus has high melting point. The polyester resin may have a melting point of 200° C. or higher, preferably 220° C. to 380° C., more preferably 260° C. to 320° C. If the melting point of the polyester resin exceeds 380° C., the polyester resin can exhibit poor processability.

The polyester resin may have a structure in which an aromatic ring and a cycloaliphatic ring are contained in the main chain. Specifically, the polyester resin may be prepared through polycondensation of an aromatic dicarboxylic acid component with a diol component including a cycloaliphatic diol.

The dicarboxylic acid component may include aromatic dicarboxylic acids and derivatives thereof. For example, the dicarboxylic acid component may include terephthalic acid, isophthalic acid, phthalic acid, and naphthalene dicarboxylic acid, and terephthalic acid is preferably used as the dicarboxylic acid component.

The diol component may include a cycloaliphatic diol to contain a cyclic repeat unit in the main chain. For example, 1,4-cyclohexanedimethanol (CHDM) is preferably used as the diol component.

The diol component may further include an aliphatic diol in addition to 1,4-cyclohexanedimethanol. The aliphatic diol may include ethylene glycol. When ethylene glycol is included, the diol component may include 15 wt % to 100 wt % of 1,4-cyclohexanedimethanol and 0 wt % to 85 wt % of ethylene glycol. Preferably, the diol component may include 30 wt % to 80 wt % of 1,4-cyclohexanedimethanol and about 20 wt % to 70 wt % of ethylene glycol. The diol component including ethylene glycol can improve mechanical properties such as impact resistance without deterioration in heat resistance of the polyester resin.

In addition, at least one $C_6$ to $C_{21}$ aromatic diol or $C_3$ to $C_8$ aliphatic diol may be further included as the diol component in order to modify the polyester resin. Examples of the $C_6$ to $C_{21}$ aromatic diol or the $C_3$ to $C_8$ aliphatic diol may include propane-1,3-diol, butane-1,4-diol, pentane-1,5-diol, hexane-1,6-diol, 3-methylpentane-2,4-diol, 2-methylpentane-1,4-diol, 2,2,4-trimethylpentane-1,3-diol, 2-ethylhexane-1,3-diol, 2,2-diethylpropane-1,3-diol, 1,4-cyclobutanedimethanol, 2,2-bis-(3-hydroxy ethoxyphenyl)-propane, 2,2-bis-(4-hydroxypropoxyphenyl)-propane, and the like.

The polyester resin may be a compound which is obtained through polycondensation of terephthalic acid with 1,4-cyclohexanedimethanol and has a repeat unit represented by Formula 1:

[Formula 1]

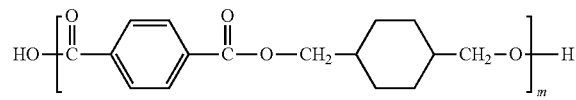

wherein m is an integer from 10 to 500.

Preferably, the polyester resin is polycyclohexanedimethylene terephthalate (PCT).

The polyester resin (A) may have an intrinsic viscosity (η) of 0.4 dl/g to 1.5 dl/g, preferably 0.5 dl/g to 1.2 dl/g, as measured in an o-chlorophenol solution at 35° C. If the intrinsic viscosity (η) is less than 0.4 dl/g, the resin composition can exhibit poor mechanical properties, whereas if the intrinsic viscosity (η) exceeds 1.5 dl/g, the resin composition can exhibit poor moldability.

The polyester resin may be prepared through a typical polycondensation process known in the art, and the polycondensation process may include direct polycondensation of an acid through transesterification using glycol or lower alkyl ester.

The polyester resin may be present in an amount of 30 wt % to 80 wt % based on the total weight of a base resin including the polyester resin and the white pigment. If the amount of the polyester resin is less than 30 wt %, the thermoplastic resin composition can exhibit poor properties in terms of heat resistance and impact resistance, whereas if the amount of the polyester resin exceeds 80 wt %, the thermoplastic resin composition can exhibit poor properties in terms of moldability and photostability.

(B) White Pigment

The white pigment may be used to increase whiteness and reflectivity of the resin composition.

The white pigment may include at least one selected from among titanium oxide, zinc oxide, zinc sulfide, white lead, zinc sulfate, barium sulfate, calcium carbonate, aluminum oxide, and a mixture thereof.

The white pigment may be treated with a silane coupling agent or a titanium coupling agent. For example, the white pigment may be treated with a silane compound such as vinyltriethoxysilane, 3-aminopropyltriethoxysilane, and 3-glycidoxypropyltriethoxysilane.

Preferably, the white pigment is titanium oxide. The titanium oxide may be used to improve optical properties such as reflectivity and concealment. The titanium oxide may include a typical titanium oxide product, without being limited thereto. Preferably, the titanium oxide is treated with an inorganic surface treatment agent or an organic surface treatment agent. Examples of the inorganic surface treatment agent may include aluminum oxide (alumina, $Al_2O_3$), silicon dioxide (silica, $SiO_2$), zirconium dioxide (zirconia, $ZrO_2$), sodium silicate, sodium aluminate, sodium aluminum silicate, zinc oxide, mica, and the like. Examples of the organic surface treatment agent may include polydimethylsiloxane, trimethylpropane (TMP), pentaerythritol, and the like. The inorganic surface treatment agent or the organic surface treatment agent may be used in an amount of 10 parts by weight or less based on 100 parts by weight of the titanium oxide. Preferably, the titanium oxide is coated with alumina ($Al_2O_3$). The alumina-treated titanium oxide may be further modified using an inorganic surface treatment agent such as silicon dioxide, zirconium dioxide, sodium silicate, sodium aluminate, sodium aluminum silicate, zinc oxide, and mica or an organic surface treatment agent such as polydimethylsiloxane, trimethylpropane (TMP), and pentaerythritol.

The white pigment may be present in an amount of 20 wt % to 70 wt % based on the total weight of the base resin including the polyester resin and the white pigment. If the amount of the white pigment is less than 20 wt %, the thermoplastic resin composition can exhibit poor properties in terms of reflectivity and discoloration resistance, whereas if the amount of the white pigment exceeds 70 wt %, the thermoplastic resin composition can exhibit poor properties in terms of mechanical properties such as impact resistance.

(C) Silicon-Containing Graft Copolymer

The silicon-containing graft copolymer may be used to improve impact resistance without deterioration in long-term reflectivity and discoloration resistance in combination with other components of the resin composition.

The silicon-containing graft copolymer may have a core-shell structure. The silicon-containing graft copolymer may be obtained by grafting a vinyl monomer to a rubbery core structure to form a shell. Specifically, the silicon-containing graft copolymer may have a structure in which a vinyl monomer is grafted to a silicon-based rubber core.

The silicon-containing graft copolymer may be prepared by any suitable method known in the art. For example, the silicon-containing graft copolymer may be prepared by grafting at least one compound selected from the group consisting of α-methylstyrene, halogen or alkyl-substituted styrene, acrylonitrile, methacrylonitrile, $C_1$ to $C_8$ methacrylic acid alkyl esters, $C_1$ to $C_8$ acrylic acid alkyl esters, maleic anhydride, $C_1$ to $C_4$ alkyls, and N-substituted phenyl maleimide to a silicon-based rubber, subsequent to polymerization of the rubber.

The $C_1$ to $C_8$ methacrylic acid alkyl esters or the $C_1$ to $C_8$ acrylic acid alkyl esters are esters of methacrylic acid or acrylic acid, and may be esters prepared from $C_1$ to $C_8$ monohydric alcohols. Examples of the $C_1$ to $C_8$ methacrylic acid alkyl esters or the $C_1$ to $C_8$ acrylic acid alkyl esters may include methacrylic acid methyl ester, methacrylic acid ethyl ester, and methacrylic acid propyl ester. Preferably, methacrylic acid methyl ester is used.

The silicon-based rubber of the silicon-containing graft copolymer may be prepared from a cyclosiloxane compound. For example, the silicon-based rubber may be prepared from a cyclosiloxane compound selected from the group consisting of hexamethylcyclotrisiloxane, octamethylcyclotetrasiloxane, decamethylcyclopentasiloxane, dodecamethylcyclohexasiloxane, trimethyltriphenylcyclosiloxane, tetramethyltetraphenylcyclotetrasiloxane, octaphenylcyclotetrasiloxane, and mixtures thereof.

The silicon-based rubber may include 20 wt % to 95 wt % of silicon. Within this range, the silicon-containing graft copolymer can provide a synergistic effect by which the resin composition can have excellent impact resistance while exhibiting long-term photostability in combination with other components. If the amount of silicone is less than 20 wt %, the resin composition can exhibit poor long-term photostability, whereas if the amount of silicone exceeds 95 wt %, it is difficult to achieve impact resistance required for products.

In addition, the silicon-based rubber core may have a silicon content of 5 wt % to 85 wt %, preferably 20 wt % to 85 wt %, more preferably 50 wt % to 85 wt %, based on the total weight of the silicon-containing graft copolymer. Within this range, the silicon-containing graft copolymer can provide a synergistic effect of simultaneously improving long-term photostability and impact resistance of the resin composition in combination with other components.

The silicon-containing graft copolymer may be present in an amount of 0.1 to 10 parts by weight based on 100 parts by weight of the base resin including the polyester resin and the white pigment. If the amount of the silicon-containing graft copolymer is less than 0.1 parts by weight, improvement in impact resistance of the resin composition is insignificant, whereas if the amount of the silicon-containing graft copolymer exceeds 10 parts by weight, the resin composition can exhibit poor properties in terms of heat resistance, optical efficiency, and photostability.

The thermoplastic resin composition according to the invention may further include fillers having various particle shapes to improve mechanical properties and moldability. The fillers may include any suitable organic or inorganic fillers known in the art. Specifically, the fillers may include at least one selected from among glass fibers, carbon fibers, glass beads, glass flakes, carbon black, clay, kaolin, talc, mica, calcium carbonate, wollastonite, and a mixture thereof. Thereamong, glass fibers, talc, and clay are preferably used, and, more preferably glass fibers are used.

Although the glass fibers may have a circular shape in section, the shape of the glass fibers may vary depending upon desired applications. In other words, the glass fibers may have any suitable shape without limitation.

The fillers may be present in an amount of 5 wt % to 50 wt % based on the total weight of the base resin. Within this range, the fillers can improve mechanical strength and moldability of the resin composition in combination with other components.

In addition, the thermoplastic resin composition according to the present invention may further include typical additives without altering advantageous effects of the invention, and examples of the additives may include antioxidants, heat stabilizers, flame retardants, fluorescent brighteners, plasticizers, thickening agents, antistatic agents, release agents, dyes, and nucleating agents, without being limited thereto. Examples of the antioxidants may include phenol, amine, sulfur, and phosphorus antioxidants; examples of the heat stabilizers may include lactone compounds, hydroquinone compounds, halogenated copper, and iodine compounds; and examples of the flame retardants may include bromine-based, chlorine-based, phosphorus-based, antimony-based, and inorganic flame retardants.

In accordance with another aspect of the present invention, there is provided a molded article produced using the thermoplastic resin composition as set forth above.

The molded article may have a difference of 10 or less between initial reflectivity measured at a wavelength of 450 nm using a colorimeter and reflectivity measured after irradiation with an LED light source for 500 hours at 85° C./85% RH.

The molded article may be a reflector for LEDs.

Hereinafter, the present invention will be described in more detail with reference to some examples. It should be understood that these examples are provided for illustration only and are not to be construed in any way as limiting the present invention.

Details of components used in the following Examples and Comparative Examples are as follows:

(A) Polyester resin (PCT)
PCT 0302 produced by SK Chemical was used.
(B) White pigment
CR-470 produced by Tronox Pigments LLC was used.
(C) Silicon-containing graft copolymer
KANE ACE™ MR-01 (produced by KANEKA Corporation) having a silicon content of 65 wt % was used.
(D) Glass Fiber
910 produced by Owens-Corning Fiberglas Corp. was used.

Example 1

The aforementioned components were added in amounts as listed in Table 1, followed by dry blending, thereby preparing a thermoplastic resin composition. Here, the silicon-containing graft copolymer (C) was included in an amount of 1 part by weight based on 100 parts by weight of a base resin including 52.5 wt % of the polyester resin (A) and 47.5 wt % of the white pigment (B). Then, the resin composition was subjected to processing using a twin-screw extruder (0=45 mm) at a nozzle temperature of 250° C. to 350° C., thereby preparing pellets. The prepared pellets were dried at 100° C. for 4 hours or more, followed by injection molding using a horizontal injection molding machine (at a molding temperature of 280° C. to 320° C.), thereby preparing a specimen having a size of 90 mm×50 mm×2.5 mm, which in turn was evaluated as to the following properties. Results are shown in Table 1.

Example 2

A specimen was prepared in the same manner as in Example 1 except that the silicon-containing graft copolymer (C) was used in an amount of 5 parts by weight based on 100 parts by weight of the base resin.

Comparative Example 1

A specimen was prepared in the same manner as in Example 1 except that the silicon-containing graft copolymer graft copolymer (C) was not used.

(Property Evaluation)
1) Izod Impact Strength
Impact strength was measured on a ⅛" thick unnotched specimen at 23° C. in accordance with ASTM D256.
2) Reflectivity
Reflectivity was measured on a plate-type specimen at a wavelength of 450 nm. Initial reflectivity was measured in the specular component included (SCI) mode, and reflectivity was measured on the specimen after irradiation with an LED light source at a wavelength of 450 nm for 200 hours and 500 hours in a thermo-hygrostat oven at 170° C. and 85% RH to perform evaluation of reflectivity retention properties. Here, as a reflectometer, a CM3600 CIE Lab. Colorimeter (produced by KONICA MINOLTA HOLDINGS, INC.) was used.

TABLE 1

| Item | | Example 1 | Example 2 | Comparative Example 1 |
|---|---|---|---|---|
| (A) PCT | | 50 | 50 | 50 |
| (B) White pigment | | 35 | 35 | 35 |
| (C) Silicone-containing graft copolymer | | 1 | 3 | — |
| (D) Glass fiber | | 15 | 15 | 15 |
| IZOD impact strength (Unnotched) | kgf · cm/cm | 16.0 | 16.7 | 15.4 |
| Reflectivity | Initial | 93.2 | 93.9 | 93.0 |
| | 200 hours | 88.4 | 89.2 | 87.5 |
| | 500 hours | 83.5 | 85.1 | 82.1 |

As shown in Table 1, it can be seen that Examples 1 and 2 exhibited improved impact resistance and had high initial reflectivity and excellent reflectivity retention properties as compared with Comparative Example 1.

Although some embodiments have been described herein, it should be understood that these embodiments are provided for illustration only and are not to be construed in any way as limiting the present invention, and that various modifications, changes, alterations, and equivalent embodiments can be made by those skilled in the art without departing from the spirit and scope of the invention.

Therefore, the scope of the present invention should be defined by the appended claims and equivalents thereof.

The invention claimed is:

1. A reflector comprising a thermoplastic resin composition comprising: (A) a polyester resin comprising a diol component comprising 15 mol % to 100 mol % of 1,4-cyclohexanedimethanol and 0 mol % to 85 mol % of ethylene glycol; (B) a white pigment; and (C) a silicone-containing graft copolymer having a core-shell structure in which a vinyl monomer is grafted to a silicone-based rubber core to form a shell, the silicone-based rubber core having a silicon content of 50 wt % to 85 wt %,
    wherein the reflector has a difference of 10 or less between initial reflectivity measured at a wavelength of 450 nm using a colorimeter and reflectivity measured after irradiation with an LED light source for 500 hours in a thermo-hygrostat oven at 170° C. and 85% relative humidity (RH).

2. The reflector according to claim 1, comprising: 0.1 parts by weight to 10 parts by weight of the silicone-containing graft copolymer (C) based on 100 parts by weight of a base resin comprising 30 wt % to 80 wt % of the polyester resin (A) and 20 wt % to 70 wt % of the white pigment (B).

3. The reflector according to claim 1, wherein the silicone-containing graft copolymer (C) has a silicon content of 20 wt % to 85 wt % based on the total weight of the silicone-containing graft copolymer.

4. The reflector according to claim 1, wherein the silicone-based rubber core of the silicone-containing graft copolymer (C) is prepared from a cyclosiloxane compound selected from the group consisting of hexamethylcyclotrisiloxane, octamethylcyclotetrasiloxane, decamethylcyclopentasiloxane, dodecamethylcyclohexasiloxane, trimethyltriphenylcyclosiloxane, tetramethyltetraphenylcyclotetrasiloxane, octaphenylcyclotetrasiloxane, and mixtures thereof.

5. The reflector according to claim 1, wherein the polyester resin is polycyclohexanedimethylene terephthalate (PCT).

6. The reflector according to claim 1, wherein the white pigment is selected from the group consisting of titanium oxide, zinc oxide, zinc sulfide, white lead, zinc sulfate, barium sulfate, calcium carbonate, aluminum oxide, and mixtures thereof.

7. The reflector according to claim 1, further comprising: filler selected from the group consisting of glass fibers, carbon fibers, glass beads, glass flakes, carbon black, clay, kaolin, talc, mica, calcium carbonate, wollastonite, and mixtures thereof.

8. The reflector according to claim 1, wherein the vinyl monomer grafted to the silicone-based rubber core to form the shell of the silicone-containing graft copolymer (C) is selected from the group consisting of α-methylstyrene, halogen-substituted styrene, alkyl-substituted styrene, acrylonitrile, methacrylonitrile, $C_1$ to $C_8$ methacrylic acid alkyl ester, $C_1$ to $C_8$ acrylic acid alkyl ester, maleic anhydride, $C_1$ to $C_4$ alkyl, and/or N-substituted phenyl maleimide.

9. The reflector according to claim 8, wherein the vinyl monomer grafted to the silicone-based rubber core to form the shell of the silicone-containing graft copolymer (C) consists of one or more of $C_1$ to $C_8$ methacrylic acid alkyl esters and/or $C_1$ to $C_8$ acrylic acid alkyl esters.

10. The reflector according to claim 8, wherein the vinyl monomer grafted to the silicone-based rubber core to form the shell of the silicone-containing graft copolymer (C) consists of one or more of methacrylic acid methyl ester, methacrylic acid ethyl ester, and/or methacrylic acid propyl ester.

11. A reflector comprising:
100 parts by weight of a base resin comprising (A) 30 wt % to 80 wt % of polycyclohexanedimethylene terephthalate (PCT); (B) 20 wt % to 70 wt % of titanium oxide; and 5 wt % to 50 wt % of glass fibers; and 0.1 parts by weight to 10 parts by weight of (C) a silicone-containing graft copolymer having a core-shell structure in which a vinyl monomer is grafted to a silicone-based rubber core to form a shell, wherein the vinyl monomer grafted to the silicone-based rubber core to form the shell of the silicone-containing graft copolymer (C) consists of one or more $C_1$ to $C_8$ methacrylic acid alkyl esters and/or $C_1$ to $C_8$ acrylic acid alkyl esters.

12. The thermoplastic resin composition according to claim 11, wherein the vinyl monomer grafted to the silicone-based rubber core to form the shell of the silicone-containing graft copolymer (C) consists of methacrylic acid methyl ester, methacrylic acid ethyl ester, and/or methacrylic acid propyl ester.

13. The thermoplastic resin composition according to claim 11, wherein the silicone-based rubber core has a silicon content of 50 wt % to 85 wt %.

14. The thermoplastic resin composition according to claim 11, wherein the reflector produced using the thermoplastic resin composition has a difference of 10 or less between initial reflectivity measured at a wavelength of 450 nm using a colorimeter and reflectivity measured after irradiation with an LED light source for 500 hours in a thermo-hygrostat oven at 170° C. and 85% relative humidity (RH).

15. A reflector comprising:
100 parts by weight of a base resin comprising (A) 30 wt % to 80 wt % of polycyclohexanedimethylene terephthalate (PCT); (B) 20 wt % to 70 wt % of titanium oxide; and 5 wt % to 50 wt % of glass fibers; and 0.1 parts by weight to 10 parts by weight of (C) a silicone-containing graft copolymer having a core-shell structure in which a vinyl monomer is grafted to a silicone-based rubber core to form a shell,
wherein the vinyl monomer grafted to the silicone-based rubber core to form the shell of the silicone-containing graft copolymer (C) consists of one or more $C_1$ to $C_8$ methacrylic acid alkyl esters and/or $C_1$ to $C_8$ acrylic acid alkyl esters and wherein the silicone-based rubber core has a silicon content of 50 wt % to 85 wt %,
wherein the reflector produced using the thermoplastic resin composition has a difference of 10 or less between initial reflectivity measured at a wavelength of 450 nm using a colorimeter and reflectivity measured after irradiation with an LED light source for 500 hours in a thermo-hygrostat oven at 170° C. and 85% relative humidity (RH).

* * * * *